(12) United States Patent
Kim et al.

(10) Patent No.: US 10,249,902 B2
(45) Date of Patent: Apr. 2, 2019

(54) SECONDARY BATTERY TRANSFER DEVICE AND METHOD FOR DETECTING RECEIPT FAILURE OF SECONDARY BATTERY

(71) Applicant: LG CHEM LTD., Seoul (KR)

(72) Inventors: Seok Jin Kim, Daejeon (KR); Min Su Kim, Daejeon (KR); Tae Yoon Jung, Daejeon (KR); Chang Min Han, Daejeon (KR); Hyun Geun Jo, Daejeon (KR); Gi Su Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 447 days.

(21) Appl. No.: 14/912,656

(22) PCT Filed: Sep. 1, 2014

(86) PCT No.: PCT/KR2014/008126
§ 371 (c)(1),
(2) Date: Feb. 18, 2016

(87) PCT Pub. No.: WO2015/030542
PCT Pub. Date: Mar. 5, 2015

(65) Prior Publication Data
US 2016/0204462 A1    Jul. 14, 2016

(30) Foreign Application Priority Data

Sep. 2, 2013 (KR) .................. 10-2013-0105000
Aug. 6, 2014 (KR) .................. 10-2014-0101341

(51) Int. Cl.
*G06F 7/00* (2006.01)
*H01M 10/04* (2006.01)
(Continued)

(52) U.S. Cl.
CPC .... *H01M 10/0404* (2013.01); *G01R 31/3627* (2013.01); *H01M 2/1005* (2013.01); *H01M 2220/30* (2013.01)

(58) Field of Classification Search
None
See application file for complete search history.

(56) References Cited

U.S. PATENT DOCUMENTS 4,583,286 A    4/1986 Schaumburg et al.
2002/0076094 A1    6/2002 Nakanishi et al.
(Continued)

FOREIGN PATENT DOCUMENTS

CN    102004105 A    4/2011
CN    102332598 A    1/2012
(Continued)

OTHER PUBLICATIONS

Extended European Search Report, dated Nov. 8, 2016, for European Application No. 14841104.4.
(Continued)

*Primary Examiner* — Yolanda R Cumbess
(74) *Attorney, Agent, or Firm* — Mintz Levin Cohn Ferris Glovsky and Popeo, P.C.; Kongsik Kim; Jhongwoo Jay Peck

(57) ABSTRACT

Disclosed herein are a secondary battery transfer apparatus for transferring a secondary battery in a secondary battery manufacturing process and a method for detecting a loading defect of a secondary battery in a carrier receiving the secondary battery. The secondary battery transfer apparatus includes a carrier having a receipt space to receive a secondary battery, a transfer unit transferring the carrier, a loading detection sensor sensing the secondary battery when the secondary battery inserted into the carrier reaches a designated height, and a controller receiving a result of
(Continued)

sensing of the loading detection sensor and controlling operation of the transfer unit. The secondary battery transfer apparatus and the detection method detect whether or not a case of the secondary battery is damaged due to friction with the carrier and thus recognize a product defect in advance.

9 Claims, 5 Drawing Sheets

(51) Int. Cl.
*G01R 31/36* (2019.01)
*H01M 2/10* (2006.01)

(56) References Cited

U.S. PATENT DOCUMENTS

| | | | |
|---|---|---|---|
| 2006/0277750 A1* | 12/2006 | Pol | H01M 10/0404 29/623.1 |
| 2010/0090654 A1 | 4/2010 | Breiting et al. | |
| 2011/0274953 A1 | 11/2011 | Hato et al. | |
| 2012/0148890 A1* | 6/2012 | Goto | H01M 2/1077 429/90 |

FOREIGN PATENT DOCUMENTS

| | | | |
|---|---|---|---|
| CN | 102765593 A | | 11/2012 |
| CN | 103219539 A | | 7/2013 |
| JP | 54-129431 A | | 10/1979 |
| JP | 59-181469 A | | 10/1984 |
| JP | H04-133274 A | | 5/1992 |
| JP | H06-176770 A | | 6/1994 |
| JP | H10-250833 A | | 9/1998 |
| JP | 11-73948 A | | 3/1999 |
| JP | H11-312538 A | | 11/1999 |
| JP | 2002-184386 A | | 6/2002 |
| JP | 2003-059463 A | | 2/2003 |
| JP | 2005-228533 A | | 8/2005 |
| JP | 2008-204729 A | | 9/2008 |
| JP | 2010-212142 A | | 9/2010 |
| JP | 2011-198511 A | | 10/2011 |
| JP | 2011-238375 A | | 11/2011 |
| KR | 10-1998-0031085 A | | 7/1998 |
| KR | 10-2002-0079194 A | | 10/2002 |
| KR | 10-2002-0087534 A | | 11/2002 |
| KR | 2003-0037579 A | | 5/2003 |
| KR | 10-2006-0092595 A | | 8/2006 |
| KR | 20060133260 A | | 12/2006 |
| KR | 10-1094028 B1 | | 12/2011 |

OTHER PUBLICATIONS

Taiwanese Office Action, including an English translation of the Taiwanese Office Action and English translation of the Taiwanese Search Report, dated Aug. 22, 2016, for Taiwanese Application No. 103130102.
International Search Report issued in PCT/KR2014/008126 dated Jan. 7, 2015.

* cited by examiner

SECONDARY BATTERY TRANSFER DEVICE AND METHOD FOR DETECTING RECEIPT FAILURE OF SECONDARY BATTERY

BACKGROUND OF THE INVENTION

Field of the Invention

The present invention relates to a secondary battery transfer apparatus for transferring a secondary battery in a secondary battery manufacturing process and a method for detecting a loading defect of a secondary battery in a carrier receiving the secondary battery.

Description of the Related Art

As demand for mobile devices rapidly increases, demand for secondary batteries applied to mobile devices increases and thus technical research on secondary batteries is vigorously carried out.

In general, secondary batteries are rechargeable and may be small-sized and large-sized, and a lithium (Li) battery is representatively used as a secondary battery.

A secondary battery includes a battery cell and an electrolyte within a secondary battery case. The battery cell includes cathode and anode plates, which are formed of materials which may perform intercalation and deintercalation of lithium ions and alternately stacked, and separator films interposed between the cathode and anode plates so that the cathode and anode plates do not contact directly.

After the battery cell is inserted and the electrolyte is injected into a secondary battery case, the secondary battery is received in a carrier and transferred to a desired position for an additional process, such as sealing of the side surfaces of the case. Such receipt and transfer of secondary battery are carried out automatically.

During the process of receiving the secondary battery in the carrier, a secondary battery may be abnormally loaded in the carrier. In this case, the corner of the secondary battery case may contact the corner of the carrier and thus, the secondary battery case may be damaged or the shape of the secondary battery case may be deformed. Further, the electrolyte may leak to the outside of the secondary battery case due to damage to the secondary battery case and leakage of the electrolyte may cause secondary problems, such as explosion of the secondary battery.

SUMMARY OF THE INVENTION

Therefore, the present invention has been made in view of the above problems, and it is an object of the present invention to provide a transfer apparatus for detecting a secondary battery abnormally loaded in a carrier and a detection method thereof.

In accordance with an aspect of the present invention, the above and other objects can be accomplished by the provision of a secondary battery transfer apparatus including a carrier having a receipt space to receive a secondary battery, a transfer unit transferring the carrier, a loading detection sensor sensing the secondary battery when the secondary battery inserted into the carrier reaches a designated height, and a controller receiving a result of sensing of the loading detection sensor and controlling operation of the transfer unit. The loading detection sensor may sense electrode taps protruded upward from the secondary battery when the electrode taps reach the designated height.

Particularly, the loading detection sensor may include a light emitting unit located at one side of the transfer unit and emitting light in the direction of the secondary battery and a light receiving unit sensing the light emitted from the light emitting unit and, if the secondary battery is abnormally loaded in the carrier, the light emitted from the light emitting unit may be blocked by the electrode taps. Further, the controller may stop operation of the transfer unit, if the light emitted from the light emitting unit is blocked by the electrode taps.

In accordance with another aspect of the present invention, there is provided a secondary battery transfer apparatus including a carrier including a box-shaped supporter and plate-shaped diaphragms formed on the supporter and separated from each other and having a receipt space formed between the upper surface of the supporter and the diaphragms to receive a secondary battery, a transfer unit transferring the carrier, light emitting units emitting light upward via a gap between the diaphragms from the upper surface of the supporter, and a light receiving unit located above the carrier, receiving the light emitted from the light emitting units, and outputting the quantity of the received light.

The secondary battery transfer apparatus may further include a controller judging whether or not the secondary battery is normally loaded in the receipt space according to the quantity of the light. Particularly, if the secondary battery is abnormally loaded in the receipt space, as a result of judgment, the controller may output identifiers of the carrier and the secondary battery.

In accordance with yet another aspect of the present invention, there is provided a method for detecting a loading defect of a secondary battery in which, during a process of transmitting a carrier loaded with the secondary battery, whether or not the secondary battery is normally loaded in the carrier is detected using a loading detection sensor sensing the secondary battery when the secondary battery reaches a designated height. The loading detection sensor may employ an optical sensor.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Now, preferred embodiments in accordance with the present invention will be described in detail with reference to the annexed drawings.

Figure 1:
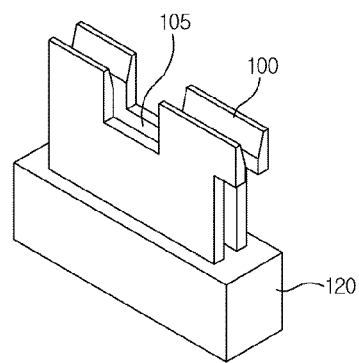
FIG. 1 is perspective view illustrating a carrier of a secondary battery transfer apparatus in accordance with one embodiment of the present invention.
Figure 2:
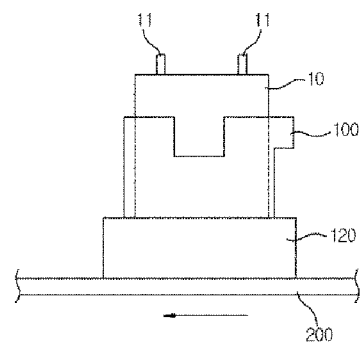
FIG. 2 is a view illustrating normal loading of a secondary battery in the carrier shown in FIG. 1.
Figure 3:
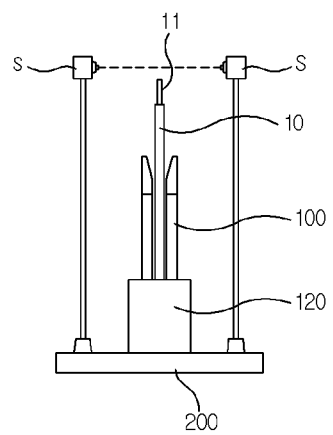
FIG. 3 is a view schematically illustrating a method for sensing a loading defect of the second battery shown in FIG. 2.
Figure 4:
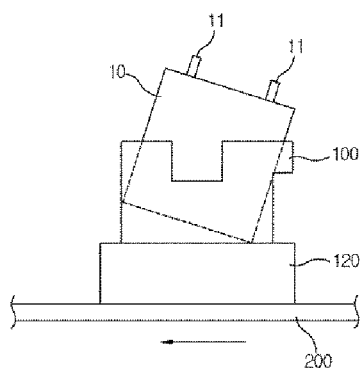
FIG. 4 is a view illustrating abnormal loading of a secondary battery in the carrier shown in FIG. 1.
Figure 5:
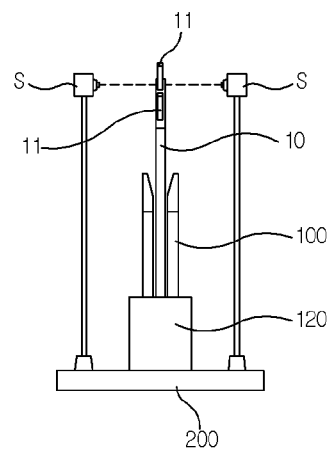
FIG. 5 is a view schematically illustrating a method for sensing a loading defect of the second battery shown in FIG. 4.

FIG. 1 is perspective view illustrating a carrier of a secondary battery transfer apparatus in accordance with one embodiment of the present invention. FIG. 2 is a view illustrating normal loading of a secondary battery in the carrier shown in FIG. 1. FIG. 3 is a view schematically illustrating a method for sensing a loading defect of the second battery shown in FIG. 2. FIG. 4 is a view illustrating abnormal loading of a secondary battery in the carrier shown in FIG. 1. FIG. 5 is a view schematically illustrating a method for sensing a loading defect of the second battery shown in FIG. 4.

With reference to FIGS. 1 to 5, a secondary battery transfer apparatus in accordance with one embodiment of the present invention includes a carrier 100, a transfer unit 200, a loading detection sensor S, and a controller (not shown). The carrier 100 has a receipt space 105 and serves to receive a secondary battery 10. The carrier 100 may have an opened upper portion and a closed lower portion. In more detail, a pair of diaphragms 110 separated from each other is formed at the opened upper portion of the carrier 100 and a supporter 120 which is connected to the lower parts of the diaphragms 110 supports the diaphragms 110 and blocks the lower parts of the separated diaphragms 110. That is, the carrier 100 includes the box-shaped supporter 120 and the plate-shaped diaphragms 110 which are separated from each other and formed on the supporter 120.

Now, the structure of the secondary battery 10 received in such a carrier 100 will be described in brief. An electrode assembly (not shown) formed by alternately stacking anode plates, separator films, and cathode plates and an electrolyte are received in a case of the secondary battery 10, and electrode taps 11 respectively connected to the anode plates and the cathode plates protrude from the case to the outside. The electrode taps 11 are electrically connected to separate external terminals. Such a structure of the secondary battery is general and a detailed description thereof will thus be omitted. Further, in addition to the pouch type secondary battery shown in the drawings, secondary batteries having various types may be applied.

The above-described carrier 100 is transferred by the transfer unit 200. The transfer unit 200 has a function of transferring the carrier 100 and the secondary battery 10 and transfers the carrier 100 and the secondary battery 10 from one position to another position through an automation method. The transfer unit 200 may employ a conveyer including a conveyer belt and driving rollers rotating the conveyer belt or employ various transfer devices addition to the conveyer.

In accordance with one embodiment, the loading detection sensor S is located at both sides of the transfer unit 200. The loading detection sensor S has a function of detecting whether or not the secondary battery 10 is normally loaded in the receipt space 105 of the carrier 100 and detects whether or not the secondary battery 10 is normally loaded in the receipt space 105 by sensing the positions of the taps 11 of the secondary battery 10. The loading detection sensor S may employ an optical sensor. In more detail, a light emitting unit S1 is located at one side of the transfer unit 200 and a light receiving unit S2 is located at the other side of the transfer unit 200. The light emitting unit S1 continuously emits light in the forward direction. The light receiving unit S2 senses the light emitted from the light emitting unit S1.

The loading detection sensor S and the transfer unit 200 are connected to the controller (not shown) and, if the light receiving unit S2 does not sense light emitted from the light emitting unit S1, the controller (not shown) may stop operation of the transfer unit 200 or provide an alarm. The loading detection sensor S may include one light emitting unit S1 and one light receiving unit S2 and thus sense a pair of electrode taps 11, or include a pair of light emitting units S1 and a pair of light receiving units S2 and thus respectively sense electrode taps 11. Further, the loading detection sensor S may employ various kinds of sensors which may sense the positions of the electrode taps, in addition to an optical sensor.

Further, the present invention provides a method for detecting a loading defect of a secondary battery, in addition to the secondary battery transfer apparatus. In such a method, a loading defect of a secondary battery 10 is detected using a difference between the height of the secondary battery 10 when the secondary battery 10 is normally loaded in the carrier 100 and the height of the secondary battery 10 when the secondary battery 10 is abnormally loaded in the carrier 100, particularly, a difference in the heights of the electrode taps of the secondary battery 10. For such a detection method, various sensors, such as an optical sensor, may be employed.

Hereinafter, the function and effects of the method for detecting a loading defect of a secondary battery and the secondary battery transfer apparatus will be described. As exemplarily shown in FIG. 2, the secondary battery 10 loaded in the carrier 100 is transferred to a desired position by the transfer unit 200. Further, as exemplarily shown in FIG. 3, the light emitting unit S1 of the loading detection sensor S emits light and the light receiving unit S2 of the loading detection sensor S receives the emitted light.

Although the carrier 100 reaches a position where the loading detection sensor S is installed, the height of the light transmitting unit S1 and the light receiving unit S2 is higher than the height of the electrode taps 11 of the secondary battery 10 and thus, the loading detection sensor S does not sense the electrode taps 11. On the other hand, as exemplarily shown in FIG. 4, if the secondary battery 10 is abnormally loaded in the carrier 10, a part of the secondary battery 10 rises to a designated height or more in the upward direction of the carrier 100. Therefore, as exemplarily shown in FIG. 5, the electrode tap 11 rising to the designated height or more blocks light emitted from the light emitting unit S1 and the light receiving unit S2 does not sense the light.

Thereby, whether or not the secondary battery 10 is normally loaded in the carrier 100 may be detected. In this case, the controller connected to the loading detection sensor S and the transfer unit 200 may stop operation of the transfer unit 200 or provide an alarm, thus informing a worker of a loading defect. Therefore, damage to the case of the secondary battery 10 due to the loading defect of the secondary battery 10 on the carrier 100 may be prevented and leakage of the electrolyte from the secondary battery 10 may be prevented.

Figure 6:
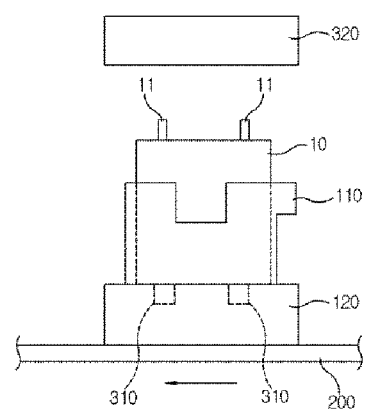
FIGS. 6 and 7 are views illustrating normal loading of a secondary battery in a carrier in accordance with another embodiment of the present invention.
Figure 7:
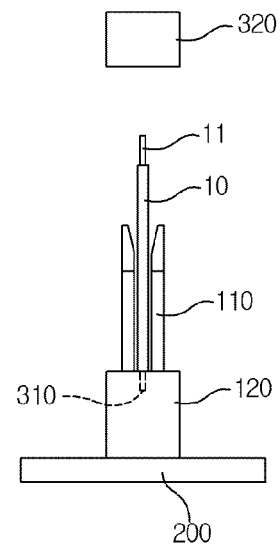
Figure 8:
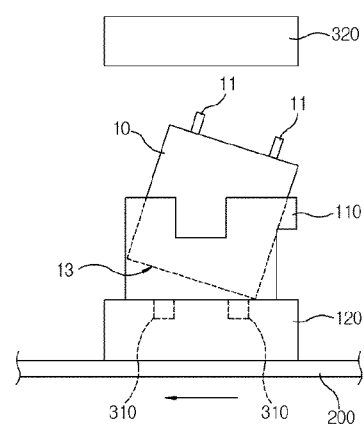
FIGS. 8 and 9 are views illustrating abnormal loading of a secondary battery in the carrier in accordance with another embodiment of the present invention.
Figure 9:
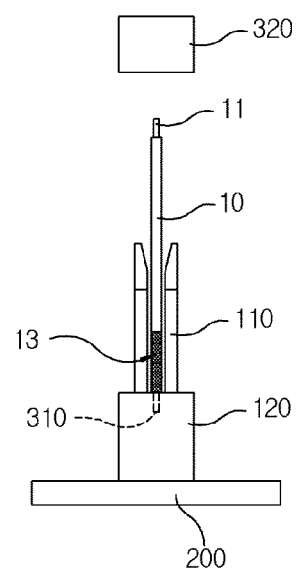

FIGS. 6 and 7 are views illustrating normal loading of a secondary battery in a carrier in accordance with another embodiment of the present invention. FIGS. 8 and 9 are views illustrating abnormal loading of a secondary battery in the carrier in accordance with another embodiment of the present invention.

Hereinafter, with reference to FIG. 1 and FIGS. 6 to 9, a secondary battery transfer apparatus and a method for detecting a loading defect of a secondary battery in accordance with another embodiment of the present invention will be described. The secondary battery transfer apparatus in accordance with this embodiment of the present invention includes a carrier 100, a transfer unit 200, light emitting units 310, a light receiving unit 320, and a controller (not shown).

The carrier 100 in accordance with this embodiment of the present invention has a receipt space 105 and receives a secondary battery 10 in the receipt space 105, in the same manner as the above-described carrier 100 shown in FIG. 1. For this purpose, the carrier 100 may have a box shape with an opened upper portion and a closed lower portion. That is, the carrier 100 may include a supporter 120 formed at the lower portion thereof and two diaphragms 110 formed on the supporter 120. The diaphragms 110 on the supporter 120 are separated from each other and thus form an opened part and the supporter 120 formed under the diaphragms 110 are formed at the lower portion of the carrier 100 so as to receive the secondary battery 10. That is, the secondary battery 10 is received by the supporter 120 and the two diaphragms 110. In summary, the carrier 100 in accordance with this embodiment of the present invention includes the box-shaped supporter 120 and the plate-shaped diaphragms 110 separated from each other and formed on the supporter 120 and forms the receipt space 105 between the upper surface of the supporter 120 and the diaphragms 110 so as to receive the secondary battery 10. The transfer unit 200 transfers the carrier 100 having the secondary battery 10 received in the receipt space 105.

Particularly, in accordance with this embodiment of the present invention, the light emitting units 310 are formed in the supporter 120. The light emitting units 310 are formed in the supporter 120 so as to emit light through the upper surface of the supporter 120 between the two diaphragms 110, and light emitting parts of the light emitting units 310 are exposed from the upper surface of the supporter 120. Thereby, the light emitting units 310 emit light upward via a gap between the diaphragms 110 from the upper surface of the supporter 120.

The light receiving unit 320 may be formed at a designated position above the carrier 100 and the transfer unit 200. The light receiving unit 320 receives light emitted from the light emitting units 310, deduces the quantity of the received light, and output such a light quantity. Although not shown in the drawings, the light receiving unit 320 may be connected to the controller and transmit the quantity of received light to the controller. The controller may detect whether or not the secondary battery 10 is normally loaded in the carrier 10 according to the quantity of light received from the light receiving unit 320.

For example, as exemplarily shown in FIGS. 6 and 7, if a secondary battery 10 is normally loaded in the carrier 100, the lower surface of the second battery 10 contacts the supporter 120 and shields the light emitting parts of the light emitting units 310. Thereby, although the light emitting units 310 continuously emit light, the light emitting parts of the light emitting units 310 are blocked by the lower surface of the secondary battery 10 and the light receiving unit 320 may not receive the light emitted from the light emitting units 310.

On the other hand, as exemplarily shown in FIGS. 8 and 9, if a secondary battery 10 is abnormally loaded in the carrier 100, the lower surface of the second battery is separated from the supporter 120. Thereby, light emitted from the light emitting parts of the light emitting units 310 may be diffracted and introduced into the light emitting unit 320 through a gap between at least one diaphragm 110 and the secondary battery 10. Therefore, the light receiving unit 320 may receive light emitted from the light emitting units 310.

As described above, if a secondary battery 10 is normally loaded in the carrier 100, the light receiving unit 320 may not receive light emitted from the light emitting units 310.

On the other hand, if a secondary battery 10 is abnormally loaded in the carrier 100, the light receiving unit 320 may receive light emitted from the light emitting units 310. The light receiving unit 320 transmits the quantity of received light to the controller whenever the carrier 100 passes by a region below the light receiving unit 320. Then, the controller judges whether or not the secondary battery 10 is normally loaded in the carrier 10 according to the light quantity received from the light receiving unit 320.

In order to sense the carrier 100 loaded with the secondary battery 10, passing by the region below the light receiving unit 320, the light receiving unit 320 may include a proximity sensor. The light receiving unit 320 measures the quantity of light received while the proximity sensor senses the carrier 100 or the secondary battery 10 and transmits the measured light quantity to the controller.

Identifiers for identifying the carrier 100 and the secondary battery 10 are respectively allotted to the carrier 100 and the secondary battery 10. These identifiers may be serial numbers. Carriers 100 loaded with secondary batteries 10 sequentially pass by the region below the light receiving unit 320, and the light receiving unit 320 sequentially senses the carriers 100 loaded with the secondary batteries 10, measures the quantities of received light, and transmits the measured light quantities to the controller. Therefore, when the controller judges that a secondary battery 10 is abnormally loaded in a carrier 100 through a light quantity received from the light receiving unit 320, the controller may output the identifier of the corresponding secondary battery 10 or carrier 100 through various output units so that a worker may recognize the identifier. For example, the controller may output the identifier of the secondary battery 10 abnormally loaded in the carrier 100 or the carrier 100 through a display device, such as a monitor. In addition, the controller may output an alarm indicating abnormal loading of the secondary battery 10 in the carrier 100. Therefore, damage to the case of the secondary battery 10 due to a loading defect of the secondary battery 10 on the carrier 100 may be prevented and leakage of the electrolyte from the secondary battery 10 may be prevented.

As apparent from the above description, a secondary battery transfer apparatus and a method for detecting a loading defect of a secondary battery in accordance with one embodiment of the present invention may detect whether or not a case of the secondary battery is damaged due to friction with a carrier and thus recognize a product defect in advance.

Further, secondary problems caused by leakage of an electrolyte due to damage to the case, such as a danger of explosion, may be prevented.

Further, the secondary battery transfer apparatus and the method for detecting a loading defect of a secondary battery in accordance with the embodiment of the present invention may be applied to a convention transfer unit and thus be economical.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A secondary battery transfer apparatus comprising:
a carrier having a receipt space to receive a secondary battery;
a transfer unit transferring the carrier;

a loading detection sensor sensing the secondary battery when the secondary battery inserted into the carrier reaches a designated height; and a controller receiving a result of sensing of the loading detection sensor and controlling operation of the transfer unit, wherein the designated height is higher than a height of electrode taps of the secondary battery which is normally loaded in the carrier, and is lower than the height of electrode taps of the secondary battery which is abnormally loaded in the carrier.

2. The secondary battery transfer apparatus according to claim 1, wherein the loading detection sensor senses electrode taps protruding upward from the secondary battery when the electrode taps reach the designated height.

3. The secondary battery transfer apparatus according to claim 2, wherein the loading detection sensor includes:

a light emitting unit located at one side of the transfer unit and emits light in the direction of the secondary battery; and a light receiving unit sensing the light emitted from the light emitting unit, wherein, if the secondary battery is abnormally loaded in the carrier, the light emitted from the light emitting unit is blocked by the electrode taps.

4. The secondary battery transfer apparatus according to claim 3, wherein the controller stops operation of the transfer unit, if the light emitted from the light emitting unit is blocked by the electrode taps.

5. A secondary battery transfer apparatus comprising:

a carrier including a box-shaped supporter and plate-shaped diaphragms formed on the supporter and separated from each other, and having a receipt space formed between the upper surface of the supporter and the diaphragms to receive a secondary battery;

a transfer unit transferring the carrier;

light emitting units emitting light upward via a gap between the diaphragms from the upper surface of the supporter; and a light receiving unit located above the carrier, receiving the light emitted from the light emitting units, and outputting the quantity of the received light.

6. The secondary battery transfer apparatus according to claim 5, further comprising a controller determining whether or not the secondary battery is normally loaded in the receipt space according to a quantity of the light.

7. The secondary battery transfer apparatus according to claim 6, wherein, if the secondary battery is abnormally loaded in the receipt space, as a result of determination, the controller outputs identifiers of the carrier and the secondary battery.

8. A method for detecting a loading defect of a secondary battery in which, during a process of transmitting a carrier loaded with the secondary battery, whether or not the secondary battery is normally loaded in the carrier is detected using a loading detection sensor sensing the secondary battery when the secondary battery reaches a designated height, wherein the designated height is higher than a height of electrode taps of the secondary battery which is normally loaded in the carrier, and is lower than the height of electrode taps of the secondary battery which is abnormally loaded in the carrier.

9. The method according to claim 8, wherein the loading detection sensor includes an optical sensor.

* * * * *